United States Patent
Muench et al.

(10) Patent No.: US 10,861,481 B2
(45) Date of Patent: Dec. 8, 2020

(54) AUTOMATIC CORRECTION OF LOUDNESS LEVEL IN AUDIO SIGNALS CONTAINING SPEECH SIGNALS

(71) Applicant: Harman Becker Automotive Systems GmbH, Karlsbad (DE)

(72) Inventors: Tobias Muench, Munich (DE); Arndt Hensgens, Karlsbad (DE)

(73) Assignee: Harman Becker Automotive Systems GmbH, Karlsbad (DE)

(*) Notice: Subject to any disclaimer, the term of this patent is extended or adjusted under 35 U.S.C. 154(b) by 0 days.

(21) Appl. No.: 16/312,778

(22) PCT Filed: Jul. 4, 2016

(86) PCT No.: PCT/EP2016/065661
§ 371 (c)(1),
(2) Date: Dec. 21, 2018

(87) PCT Pub. No.: WO2018/006927
PCT Pub. Date: Jan. 11, 2018

(65) Prior Publication Data
US 2019/0362735 A1    Nov. 28, 2019

(51) Int. Cl.
*G10L 21/034*    (2013.01)
*H04W 4/48*    (2018.01)
(Continued)

(52) U.S. Cl.
CPC .......... *G10L 21/034* (2013.01); *G10L 19/008* (2013.01); *H03G 3/24* (2013.01);
(Continued)

(58) Field of Classification Search
CPC ........ H03G 3/24; H03G 9/025; H03G 3/3005; H03G 7/002; H04R 2499/13; H04R 3/00;
(Continued)

(56) References Cited

U.S. PATENT DOCUMENTS 9,135,920 B2    9/2015    Soulodre
9,413,322 B2    8/2016    Soulodre
(Continued)

FOREIGN PATENT DOCUMENTS

EP    1522868 A1    4/2005
EP    2367287 A2    9/2011
(Continued)

OTHER PUBLICATIONS

Hess, W. et al., "Acoustical Evaluation of Virtual Rooms by Means of Binaural Activity Patterns", Audio Engineering Society Convention Paper 5864, 115th Convention, Oct. 2003, 8 pgs.
(Continued)

*Primary Examiner* — Paul Kim
(74) *Attorney, Agent, or Firm* — Brooks Kushman P.C.

(57) ABSTRACT

A method for adapting a gain of at least one channel audio input signal in order to generate an N channel audio output signal, wherein at least one channel audio input signal includes a speech input channel, in which speech signal components, if present in the at least one channel audio input signal, are present, and comprising other audio input channels. A perceived loudness of the at least one channel audio input signal is dynamically determined and it is determined whether speech signal components are present in the speech input channel. If this is the case the gain of the speech input channel is adapted differently compared to the gain of the other audio input channels.

18 Claims, 9 Drawing Sheets

(51) Int. Cl.
*G10L 19/008* (2013.01)
*H03G 3/24* (2006.01)
*H03G 3/30* (2006.01)
*H03G 7/00* (2006.01)
*H03G 9/02* (2006.01)
*H04R 3/00* (2006.01)
*H04S 3/00* (2006.01)

(52) U.S. Cl.
CPC .......... *H03G 3/3005* (2013.01); *H03G 7/002* (2013.01); *H03G 9/025* (2013.01); *H04R 3/00* (2013.01); *H04S 3/008* (2013.01); *H04W 4/48* (2018.02); *H04R 2499/13* (2013.01)

(58) Field of Classification Search
CPC ..... G10L 19/008; G10L 21/034; H04S 3/008; H04W 4/48
USPC .......................................................... 381/57
See application file for complete search history.

(56) References Cited

U.S. PATENT DOCUMENTS

| 2004/0213420 | A1* | 10/2004 | Gundry | ................. H03G 7/004 381/104 |
| 2011/0222695 | A1* | 9/2011 | Hess | ....................... H03G 3/32 381/56 |
| 2015/0381131 | A1* | 12/2015 | Wang | ................... H03G 3/3005 381/107 |
| 2017/0092289 | A1* | 3/2017 | Suzuki | .................... G10L 15/26 |

FOREIGN PATENT DOCUMENTS

| JP | 2004129187 A | 4/2004 |
| JP | 2010136173 A | 6/2010 |
| WO | 2007123608 A1 | 11/2007 |

OTHER PUBLICATIONS

International Search Report dated Mar. 8, 2017, PCT/EP2016/065661 filed Jul. 4, 2016, 12 pgs.

Lindemann, W. et al., "Extension of a Binaural Cross-Correlation Model by Contralateral Inhibition. I. Simulation of Lateralization for Stationary signals", Journal of Acoustic Society of America, Dec. 1986, p. 1608-1622, vol. 80(6).

ITU-R (International Telecommunications Union), "Algorithms to Measure Audio Programme Loudness and True-Peak Audio Level," BS.1770-1, Sep. 2007, 19 pgs.

English Translation of Japanese Office Action dated Jul. 21, 2020 for Japanese Application No. 2018-556359, 8 pgs.

* cited by examiner

AUTOMATIC CORRECTION OF LOUDNESS LEVEL IN AUDIO SIGNALS CONTAINING SPEECH SIGNALS

CROSS-REFERENCE TO RELATED APPLICATION

This application is the U.S. national phase of PCT Application No. PCT/EP2016/065661 filed on Jul. 4, 2016, the disclosure of which is incorporated in its entirety by reference herein.

TECHNICAL FIELD

The present application relates to a method for adapting a gain of an N channel audio input signal containing at least two different tracks with different signal level ranges and containing possible speech signal components. Furthermore, the corresponding system therefor is provided.

BACKGROUND

In the art many different sources of audio signals containing music and/or speech are known. The music signal can be stored on a CD, a DVD or on any other storage medium. Especially with the development of new compression schemes such as MPEG audio signals with different genres and artists are stored on a storage medium and may be combined to a playlist to be played out to a user. Especially in a vehicle environment the audio signals perceived by the passengers contain the audio signal itself and road tire noise, aerodynamics noise and engine noise. The different audio signals of the different audio sources often have different signal and dynamics compression levels. Often, different tracks of an audio output signal have different signal level ranges which are perceived by the user with a different loudness level. Especially in a vehicle environment the received audio signal should be perceivable to the user, meaning that it has to exceed the noise present in the vehicle. At the same time the overall audio signal level should not exceed a certain level where a hearing damage could be generated or where the perception is painful for the user.

When playing back movies with multichannel audio in a vehicle environment, the centre channel is playing back speech and dialogues. However the perceived loudness of the speech material is often not sufficient so that the dialogues can not be properly perceived by the user.

SUMMARY

Accordingly, a need exists to allow a dynamic automatic correction of a loudness level in audio signals, while maintaining a good perception of the speech signals present in the audio signal, especially in a noisy environment.

This need is met by the features of the independent claims. In the dependent claims preferred embodiments of the invention are described.

According to a first aspect a method for adapting a gain of an N channel audio input signal is provided in order to generate an N channel audio output signal, wherein the N channel audio input signal comprises a speech input channel in which speech signal components, if present in the N channel audio input signal, are present. The N channel audio input signal further comprises other audio input channels. According to one step of the method a perceived loudness of the N channel audio input signal is dynamically determined. Furthermore it is determined whether speech signal components are present in the speech input channel. If speech signal components are present in the speech input channel, a gain of the other audio input channels is dynamically adapted in a first gain control unit based on the determined perceived loudness of the N channel audio input signal with a first gain parameter such that at least two consecutive tracks of the other audio output channels output from the first gain control unit are limited to a predefined range of signal levels or a predefined loudness range. A gain of the speech input channel is dynamically adapted in a second gain control unit based on the determined loudness of the N channel audio input signal with a second gain parameter such that at least two consecutive tracks of the speech output channel output from the second gain control unit are limited to the predefined range of signal levels or loudness range. The second gain parameter is hereby different from the first gain parameter.

Furthermore the corresponding system is provided configured to adapt a gain of the N channel audio input signal. The system comprises a loudness determining unit configured to determine a perceived loudness of the N channel audio input signal. Furthermore a speech detection unit is provided configured to determine whether speech signal components are present in the speech input channel. A first gain control unit is provided and configured to control a gain of the other audio input channels and a second gain control unit is provided configured to control a gain of the speech input channel. If speech signal components are present in the speech input signal the first gain control unit dynamically adapts the gain of the other audio input channels based on the determined perceived loudness of the N channel audio input signal with the first gain parameter such that at least two consecutive tracks of the other audio output channels output from the first gain control unit are limited to a predefined range of signal levels or predefined loudness range. The second gain control unit dynamically adapts the gain of the speech input channel based on the determined loudness of the N channel audio input signal with a second gain parameter such that at least two consecutive tracks of a speech output channel output from the second gain control unit are limited to the predefined range of signal levels or loudness range. The first gain control unit and the second gain control unit determine the first gain the second gain such that the different gain parameters are different.

It is possible that the gain of the speech input channel is increased by a higher amount compared to the gain of the other audio input channels in order to improve the intelligibility of the speech components. By way of example the first gain parameter and the second gain parameter may be determined such that the ratio of the signal level of the speech input signal to the signal level of the speech output signal is smaller than a ratio of the signal level of the other audio input channels to the signal level of the other audio output channels. In other words this means that a higher gain is applied to the speech input channel compared to other audio input channels.

A further example is such that the first gain parameter and the second gain parameter are determined such that the signal level of the speech input signal is increased by the second gain parameter by a higher amount compared to the signal level of the other audio input channel which is increased by the first gain parameter.

If the signal level of the N channel audio input signal is decreased in order to keep the signal level in the predefined range of signal levels, it is possible that the first gain parameter and the second gain parameter are determined such that the signal level of the speech input signal is decreased by the second gain parameter by a small amount compared to the signal level of the other audio input channel decreased by the first gain parameter.

It is to be understood that the features mentioned above or features yet to be explained below can be used not only in the respective combinations indicated, but also in other combinations or isolation without departing from the scope of the present application. The features of the above mentioned aspect embodiments may be combined with each other in other embodiments unless explicitly mentioned otherwise.

BRIEF DESCRIPTION OF THE DRAWINGS

The foregoing and additional features and effects of the application will become apparent from the following detailed description when read in conjunction with the accompanying drawings in which like reference numbers refer to like elements.

DETAILED DESCRIPTION

In the following, embodiments of the invention will be described in detail with reference to the accompanying drawings. It is to be understood that the following description of embodiments is not to be taken in a limiting sense. The scope of the invention is not intended to be limited by the embodiments described hereafter or by the drawings which are to be taken demonstratively only.

The drawings are to be regarded as being representations and elements illustrated in the drawings are not necessarily shown to scale. Rather, the various elements are represented such that their function and a general purpose become apparent to a person skilled in the art. Any connection or coupling between functional blocks, devices, components or physical functional units shown in the drawings or described herein may be implemented by an indirect connection or coupling. A coupling between components may be established over a wired or wireless connection. Furthermore, functional blocks may be implemented in hardware, software, firmware, or a combination thereof.

Figure 1:
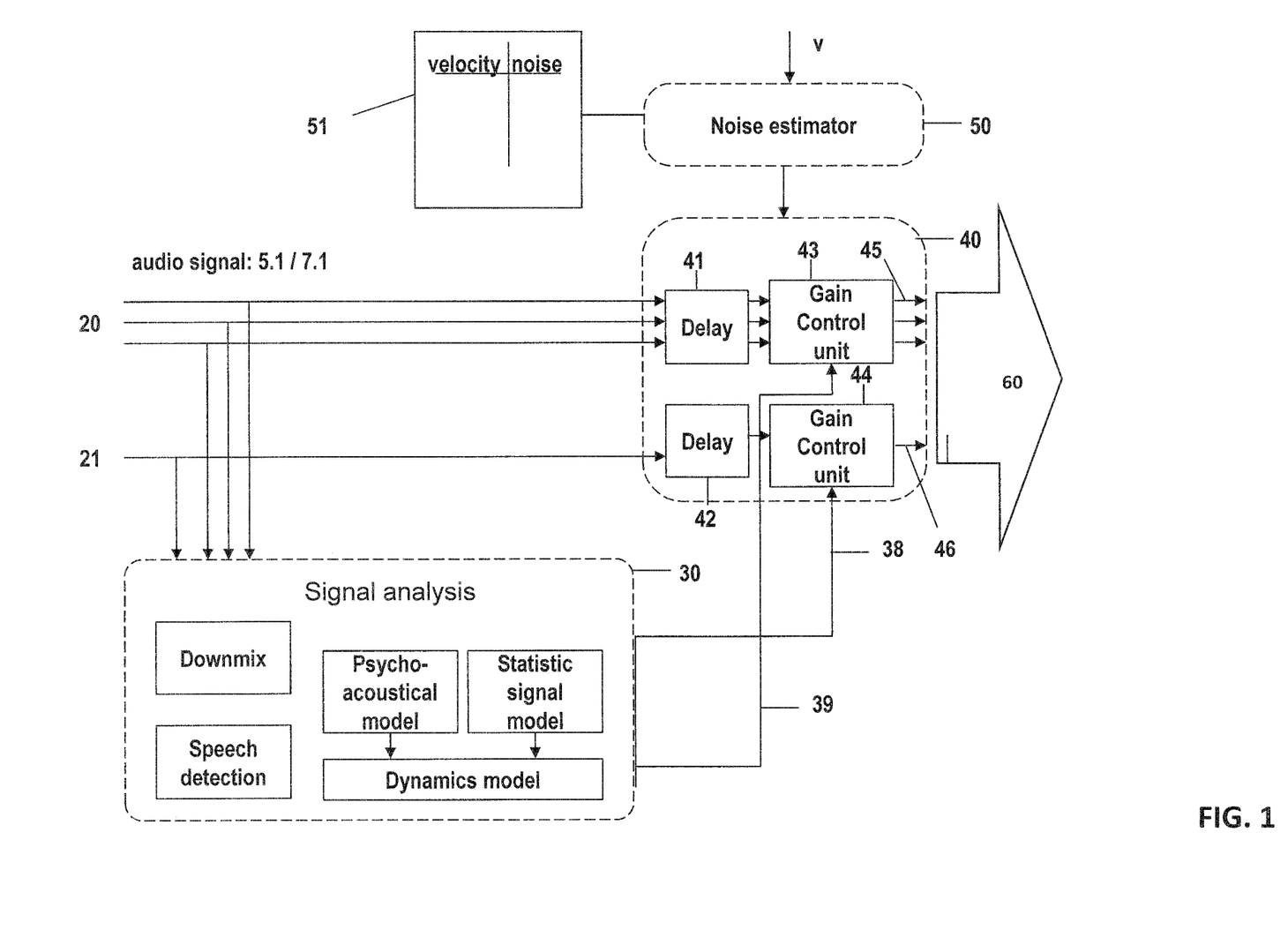
FIG. 1 schematically shows the system used to adapt the gain of the N channel audio input signal.

In FIG. 1 a system is shown with which the loudness of an N channel audio input signal can be adapted. The N channel audio input signal can be 5.1. or 7.1. audio signal and may be stored on a CD or DVD or any other storage unit such as a hard disk. The N channel audio input signal comprises a speech input channel 21, where speech signal components, if present in the input signal are present. In a 5.1. or 7.1. audio signal the speech input channel can be the center channel. Furthermore the N channel audio input channel comprises other audio input channels 20.

The system shown comprises an audio signal analyzing unit 30 in which inter alia the loudness of the channel audio input signal, is determined using a psycho-acoustical localization model of the human hearing and using signal statics.

In the signal analyzing unit 30 the loudness is determined based on a psycho-acoustical model of the human hearing and based on signal statistics. As described in further detail below, the psycho-acoustical model is used to estimate the loudness, for localization of sound, and to determine whether noise is present in the audio input signal as a dominant factor, e.g. during a pause or between two tracks. The signal statistics is the second basis for determining or estimating the loudness and for determining whether a pause with noise is present in the audio signal. By way of example the signal strength of the entertainment audio signal can be determined. Based on the psycho-acoustical model alone or in combination with the statistical signal model a loudness adaptation is determined by dynamically determining adaptive time constants as will be described in further detail below.

Figure 2:
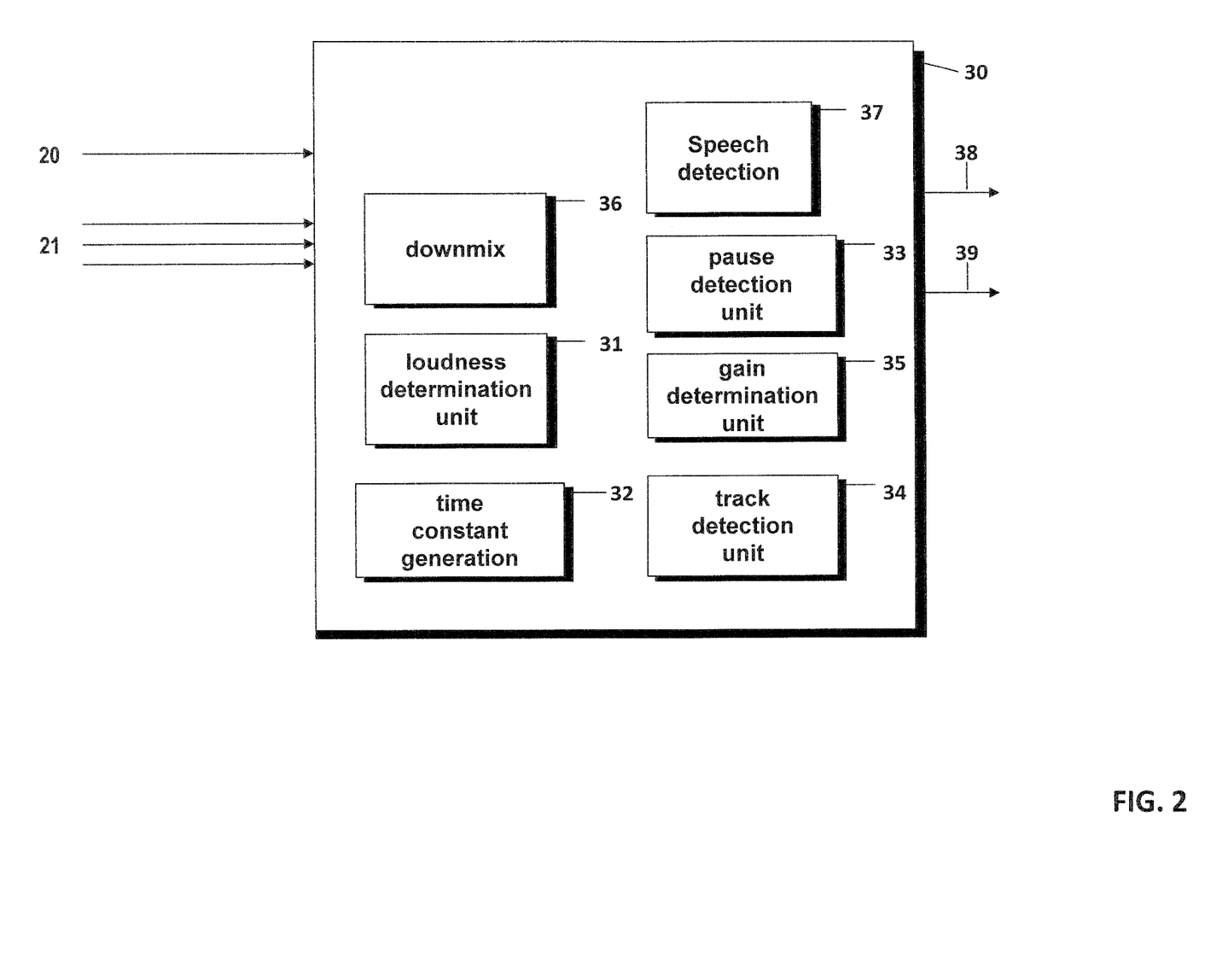
FIG. 2 shows a more detailed view of an audio analyzing unit that is used to determine the loudness of the audio input signal, and detect speech signal components in a speech input channel of the N channel audio input signal.

In FIG. 2 a more detailed view of the audio signal analyzing unit 30 is shown.

In the audio signal analysing unit 30 the N channel audio input signal may be subject to a downmix in a downmixing unit 36. In the present example downmixing means that it is decided in the downmixing unit whether in the N channel audio input signal the different channels are analysed separately in the signal analysing unit 30 or whether certain groups of audio signals are generated. By way of example the front signal channels of a 5.1 surround signal may be grouped together to one group or the front signal channels and the centre channel whereas the rear channels or the surround channels are grouped to another group. Accordingly in the down mixing unit it is determined in which groups the different input channels of the audio input signal are processed or whether all channels are processed separately. The speech input channel 20 is furthermore fed to a speech detection unit 37 where it is detected whether speech components are present in the speech input channel. If speech signal components such as a dialogue are present in the N channel audio input signal, then they are present in the speech input channel. The other audio input channels 20 do not comprise speech signal components. The speech detection unit is explained in further detail later on with reference to FIG. 5.

The audio signal analyzing unit furthermore comprises a loudness determination unit 31 estimating a loudness of the received audio input signal. The loudness determination unit 31 may determine the loudness with methods known in the art and as described inter alia in ITU-R BS 1770-1. For further details of a localization of the N channel audio input signal and determination of the loudness reference is also made "Acoustical Evaluation of Virtual Rooms by Means of Binaural Activity Patterns" by Wolfgang Hess et al. in Audio Engineering Society Convention Paper 5864, 115$^{th}$ Convention, October 2003, to W. Lindemann "Extension of a Binaural Cross-Correlation Model by Contralateral Inhibition. I. Simulation of Lateralization for Stationary Signals", in Journal of Acoustic Society of America, December 1986, p. 1608-1622, Vol. 80 (6), and to ITU-R BS 1770-1. However it should be mentioned that any other method for determining a loudness of an audio signal known in the art may be used.

The loudness determination unit 31 may furthermore use a binaural model of the human hearing for determining the loudness and for determining whether and where the input signals 20 and 21 could be localized by a user when hearing said audio input signal. This binaural model simulates the spatial perception of the audio input signal and allows to determine whether the audio input signal contains mainly noise or any other input signal such as music or speech. The localization of the audio input signal is described in more detail in the documents mentioned earlier in the present application, or as mentioned in EP 1 522 868 A1, in the document of W. Lindemann or in the Audio Engineering Society Convention Paper 5864 mentioned above. This localization technique allows to discriminate noise from other sound signals and helps to avoid that if only noise is detected in the audio input signal, that this noise is output with an increased gain. It also allows to reset adaptive time constants generated by a time constant generation unit 32, when a pause was detected. The loudness determination unit 31 estimates the loudness of the audio input signal using the psycho-acoustical model of the human hearing. The detection of a pause between two consecutive tracks is schematically shown by pause detection unit 33.

Furthermore, the loudness determination unit 31 can additionally use a statistical signal processing in order to estimate the loudness of the audio input signal or to detect signal pauses. In the statistical analysis of the audio input signal the actual signal level of different samples of the audio input signal is determined. By way of example if the signal level of several consecutive samples of the input signal follows a Gaussian distribution, it can be deduced that the processed samples contain noise and no other audio signal.

The audio signal analysing unit then uses the result of the loudness estimation for calculating time constants that are introduced into the audio input signals 20 and 21. In FIG. 2 the calculation of the time constants is symbolized by the time constant generator 32. The time constants help to adapt the gain as described in detail in connection with FIG. 6

Figure 7:
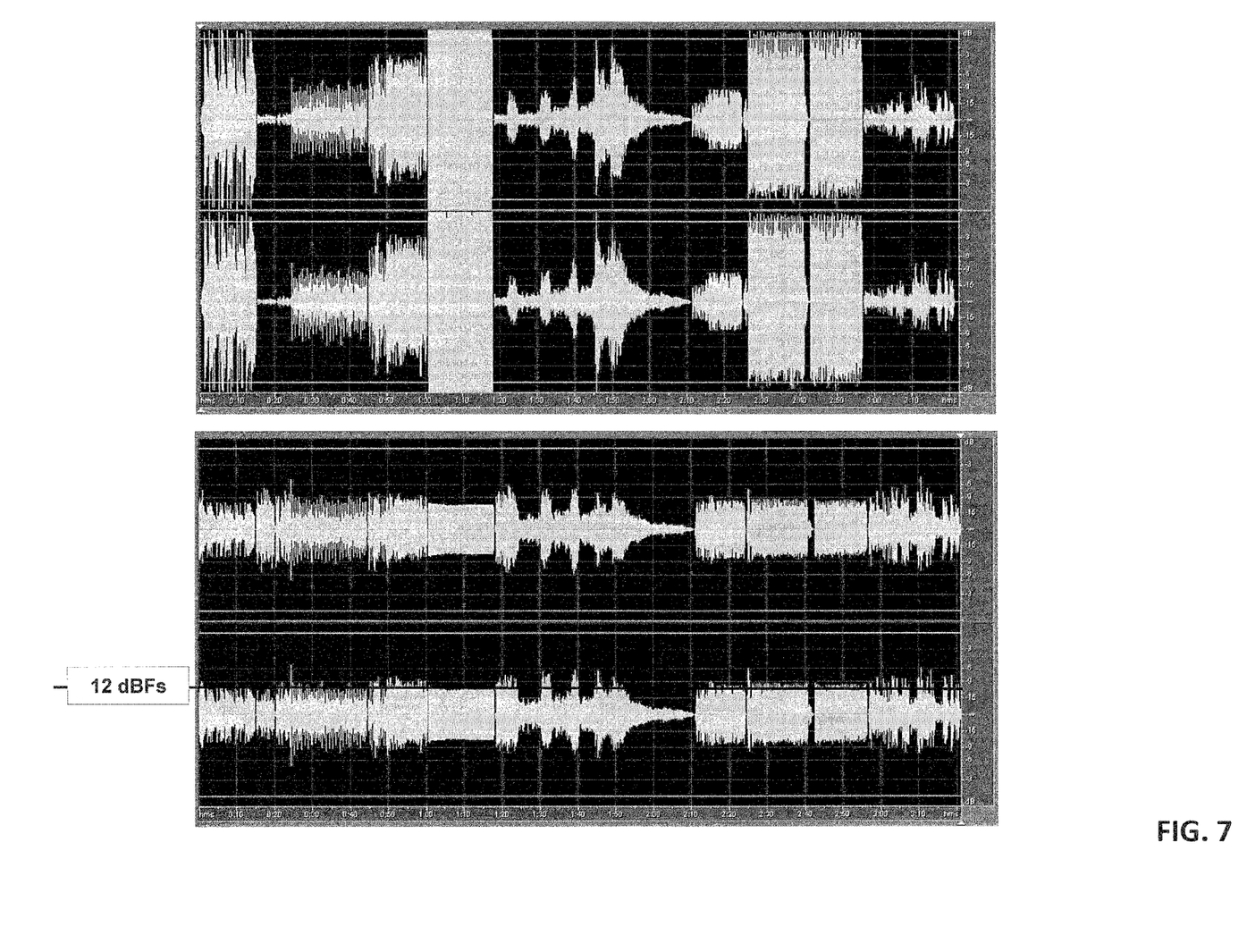
FIG. 7 shows signal levels of the N channel audio input signal before and after automatic loudness adaptation wherein the signal level is decreased in order to stay within a defined range of signal levels.
Figure 8:
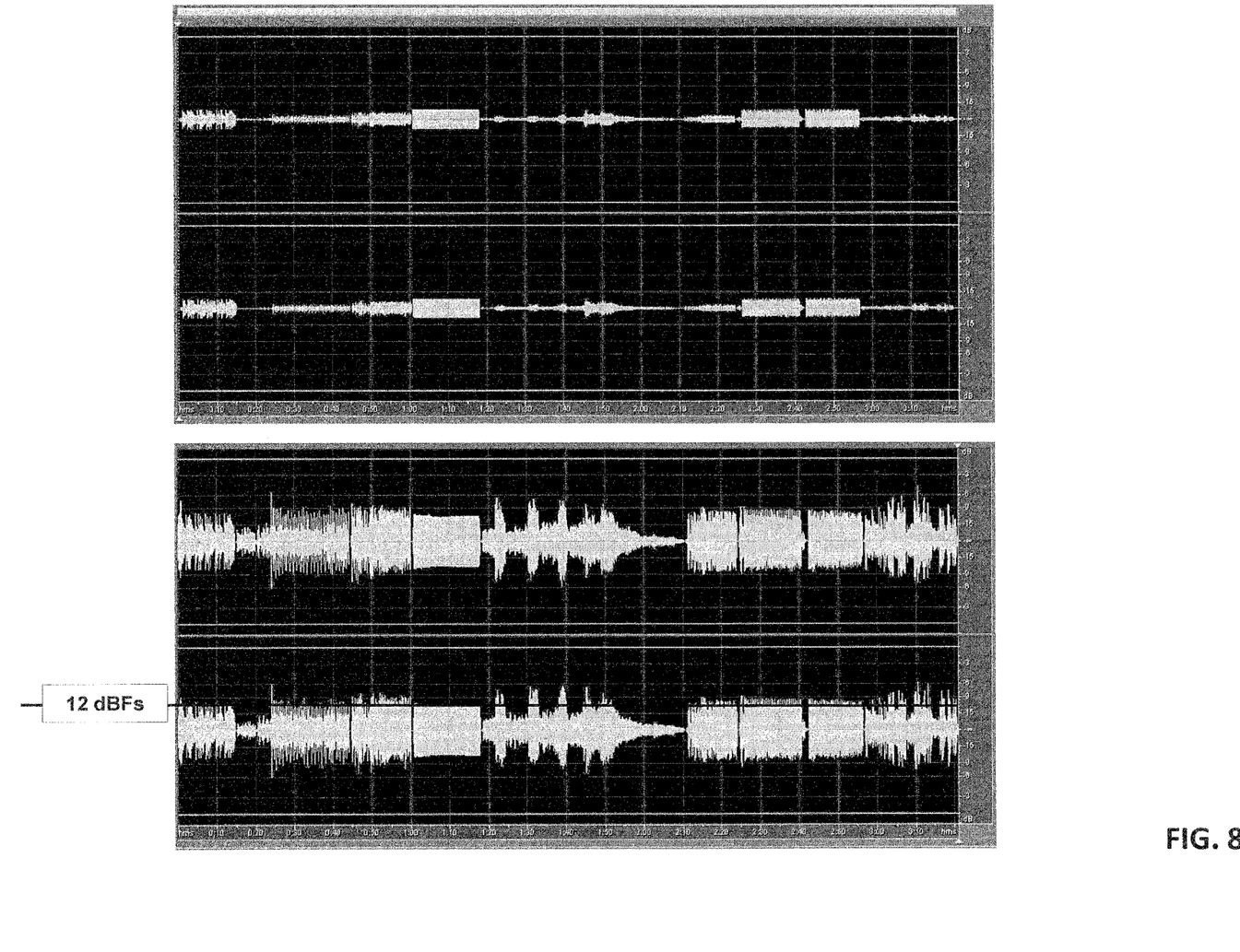
FIG. 8 shows another example of signal levels of the N channel audio input signal before and after automatic loudness adaptation wherein the signal level is increased.

The audio signal analysing unit 30 further comprises a gain determination unit 35 which adapts the gain of the speech input channel 21 and of the other audio input channels 20. The loudness determination unit 31 provides a loudness for a certain part of the music input signal, e.g. a block containing several samples by emitting a dB loudness equivalent (dBLEQ). The gain determination unit 35 has a predefined signal level which should be met when outputting the audio signal, e.g. −12 dB as shown in FIGS. 7 and 8 in the lower part of the Figs or any other signal level threshold. In the gain determination unit 35 the determined loudness is subtracted from the mean signal level to be obtained in order to calculate the gain. By way of example if the determined loudness corresponds to −5 dB and if the target is −12 dB full scale, the gain has to be adapted accordingly by decreasing the gain in order to have an average signal level of about −12 dB. The gain determination unit determines a first gain parameter for the other audio input channels 20 and determines a second gain parameter for the speech input channel 21. The gain determination unit calculates the time constants that are used to adapt the gain as will be explained in connection with FIG. 6.

The gain determination unit is configured such that it adapts the gain of the speech input channel and of the other audio input channels in such a way that a dialogue present in the speech input channel can be better perceived by a user.

By way of example, when the overall signal level is increased, the signal level of the speech input signal increased the second gain parameter may be increased by a higher amount compared to the signal level of the other audio input channel which is increased by the first gain parameter. In other words this means that the first gain parameter and the second parameter are determined such that a ratio of the signal level of the speech input signal to the signal level of the speech output signal is smaller than a ratio of the signal level of the other audio input channel to the signal level of the other audio output channels.

However when the total signal level of the audio signal should be decreased in order to keep the signal within a certain range, the first gain parameter and the second gain parameter may be determined such that the signal level of the speech input signal is decreased such that the signal level of the speech input signal that is decreased by the second gain parameter is decreased by a smaller amount compared to the signal level of the other audio input channel decreased by the first gain parameter.

In a vehicle environment, depending on the vehicle used different ambient noises are perceived by the vehicle's occupants. The vehicle sound signal comprises noise components and an audio signal component. The noise signal component may be due to road tire noise, aerodynamic noise, or engine noise. The noise can have values between 60 and 85 dB SPL (Signal Pressure Level). As the hearing pain threshold is around 120 dB SPL, the range for the audio signal components is within 20-40 dB SPL.

Referring back to FIG. 1 the signal output 38 of the audio signal analysing unit for the speech input channel and the signal output 39 for the other audio input channels are input into a signal control unit 40. The signal output 38 describing the gain adaptation in the form of time constants is fed to a gain control unit 44 whereas the signal output 39 is fed to gain control unit 43. The other audio input channels 21 are input to a first delay element 41. The delay element introduces a delay into input signal 20 that is among others needed for the determination of the gain in the signal analysing unit and for detecting possible speech signal components. The delay element helps to assure that the signal processed by the signal analysing unit 30 is actually controlled with the correct time constants corresponding to the audio signal for which they were determined. In the same way the speech input signal 21 is fed to a second delay unit 42 where the corresponding delay is introduced into the speech input signal. In the embodiment shown, two different delay units 41 and 42 are provided, however as the delay introduced into signal 20 and 21 is preferably the same, a single delay unit may be used.

The signal control unit 40 furthermore comprises the gain control unit 43 for the other audio input channels and the gain control unit 44 for the speech input channel 21. The gain control units 43, 44 helps to determine to which amount a gain determined by the gain determination unit 35 is actually influencing the signal output level of other audio output channels 45 output from the gain control unit 43 or of a speech output channel 46 output from gain control unit 44. To this end a user interface (not shown) may be provided in which the user can indicate to which percentage the gain correction by the audio signal analyzing unit 30 is used for the output. If 100% of the gain should be output as present in combined output signal 60, then the values as determined by the gain determination unit 35 are taken over. However, it is also possible that a user does not want a gain adaptation, e. g. in case he or she wants to maintain the loudness evolution in a piece of music. In this example the user might set the gain adaptation in gain control unit 43 to 0%, meaning that no correction as determined in unit 30 is used for the output. In the gain control unit 43 the amount of gain correction can be determined, e.g. by setting a factor between 0% and 100%. If a factor of 0% is set, the gain is determined without the influence of the time constants.

In addition to a user interface or instead of the user interface a noise estimator 50 can be provided estimating the ambient noise in the vehicle cabin. As mentioned above the vehicle speed strongly influences the noise in the vehicle cabin. If the vehicle is travelling at a very low velocity or is at rest, a gain adaptation as determined by the gain determination unit may not be considered necessary. If the output signal 60 should not be influenced by the gain determination unit at all, meaning that no correction as determined in unit 30 is used for the output, then the gain control unit can set the factor by which the output signal is influenced by the calculation carried out in unit 30 to 0%. The noise estimator 50 can receive a vehicle velocity and can access a table 51 in which a relationship between the vehicle velocity and the noise is provided. This table may be a predefined table set by the vehicle manufacturer. Normally, the driver should not be able to adapt the values given in table 51. However, the values given in the table may be changed, e.g. by a software tool with which the sound settings can be adjusted. When the vehicle velocity is higher, the ambient noise may also be at 80 dB(A). In this example, then only 25 dB(A) remain if the threshold of 105 dB(A) should not be exceeded. With an ambient noise of 80 dB(A), the loudness of the audio output signal may be dynamically determined by the gain determination unit as described above. The gain determination unit can determine a factor between 0% and 100% based on the ambient noise, this percentage describing by which amount the loudness should be adapted as described above. In an embodiment shown the vehicle velocity is the only variable to determine the ambient noise. However, other factors may be used alone or in combination with the vehicle velocity such as the ambient noise such as the determined by a microphone (not shown).

Figure 3:
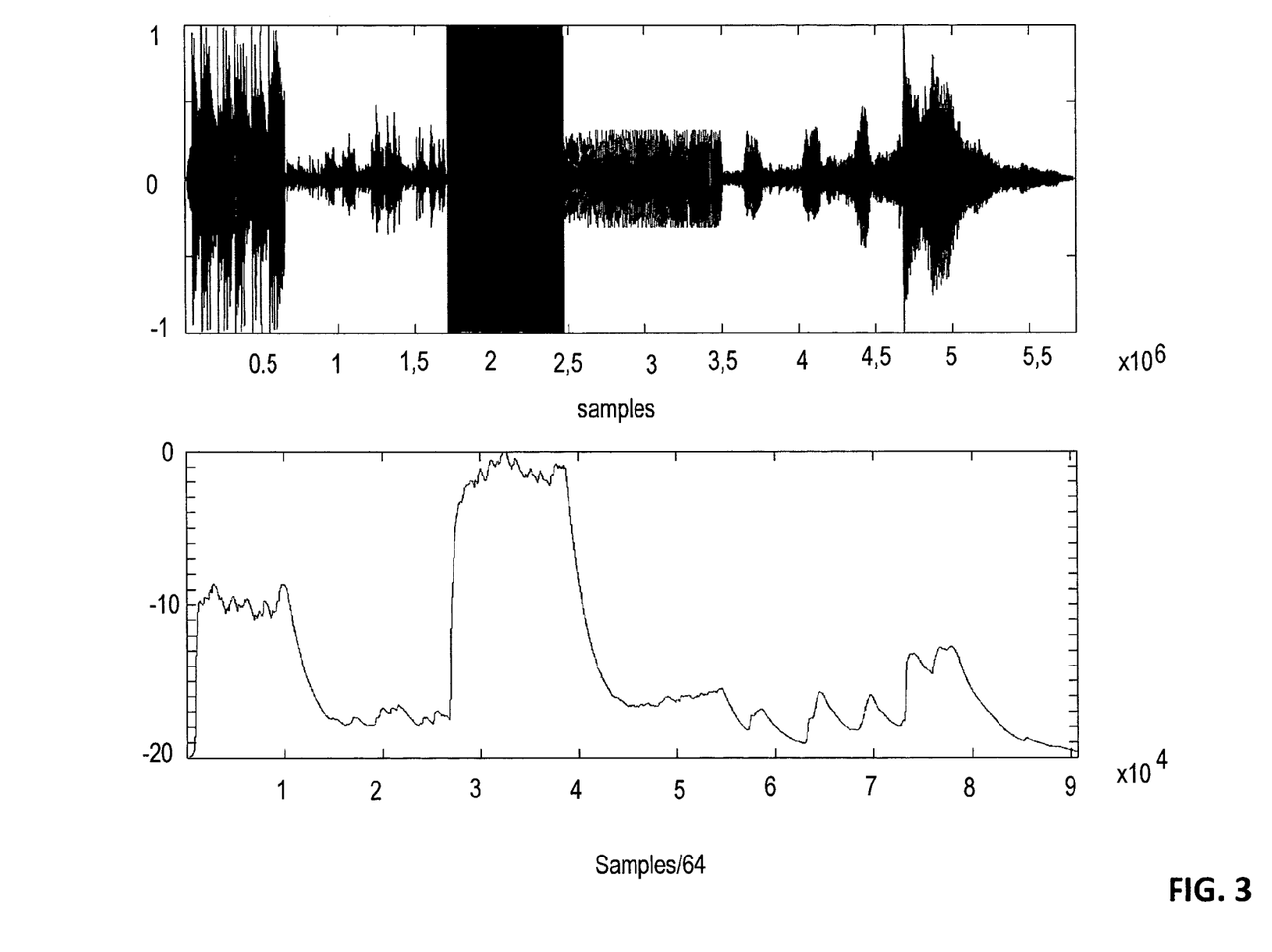
FIG. 3 shows an example of an audio input signal and the estimated loudness without gain adaptation, including different time constants to smooth loudness, i.e. fast reaction to increasing loudness and retarded reaction at decreasing loudness levels.
Figure 4:
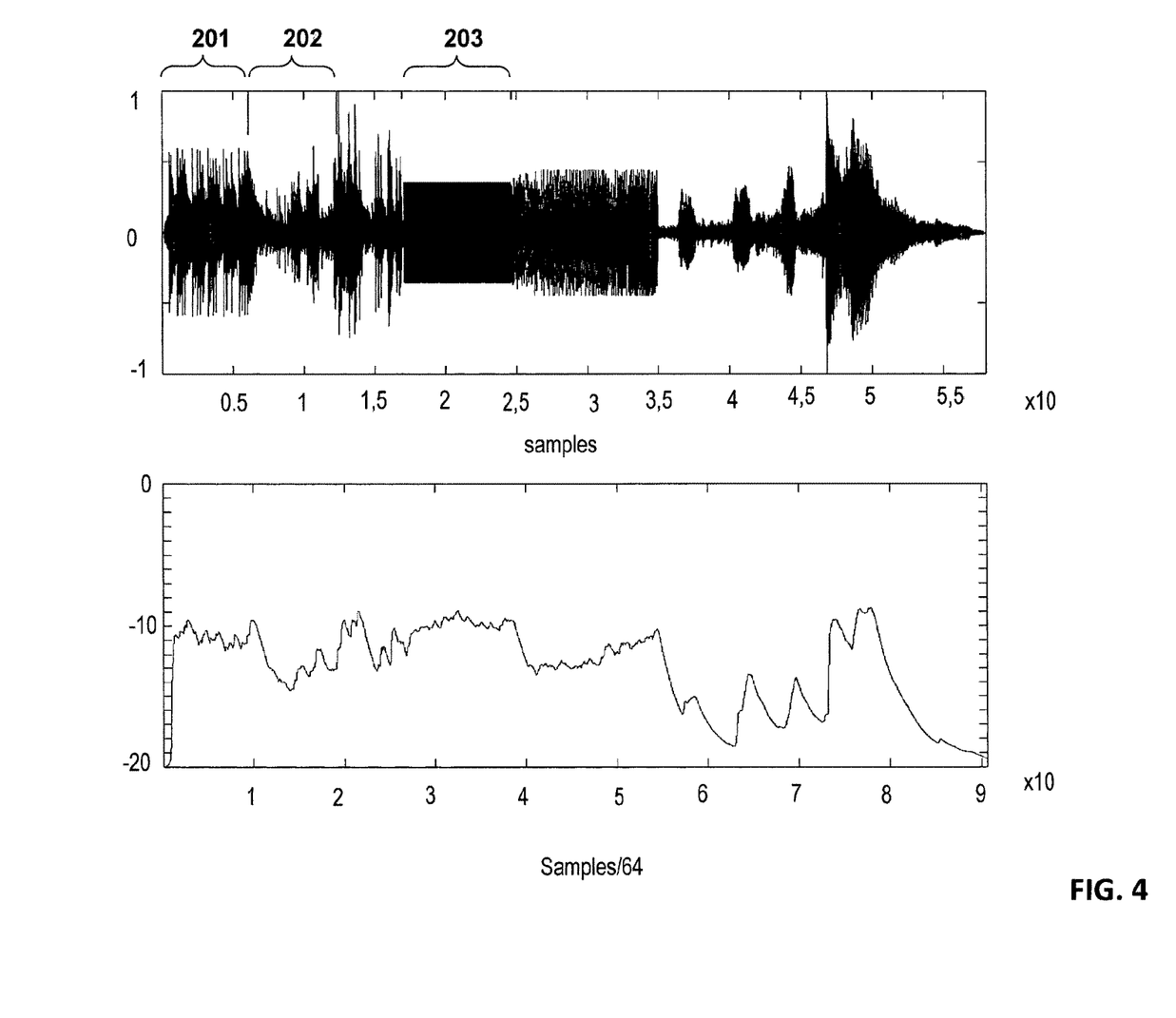
FIG. 4 shows a dynamic level adjustment of the audio input signal of FIG. 3 as it should be adjusted for an automatic loudness adjustment, corrected ideally when the full signal content is known.

In the upper part of FIG. 3 a signal level of an audio input signal is shown in full scale, meaning that 0 dB full scale (0 dBFS) is assigned to the maximum possible signal level in the digital domain, dB full scale meaning decibels relative to full scale. As can be seen from the upper part of FIG. 3, the signal level and therefore also the loudness level corresponding to the signal as perceived by a user varies considerably. In the lower part of FIG. 3 the corresponding loudness was estimated from the signal input level. One possibility for a loudness estimation is described in Recommendation ITU-R BS. 1770-1 ("Algorithms to Measure Audio Program Loudness and to a Peak Audio Level"). In the present application loudness may be estimated through a binaural localization model. If a sound signal as shown in FIG. 3 is played out to the user in a vehicle, some parts of the audio signal may be perceived in an unpleasant loudness, whereas other parts of the audio signal may be considered to be too low to be correctly perceived by the user. In FIG. 4 an ideally adjusted level of the signal of FIG. 3 is shown. By way of example the signal samples in range 201 should be adapted to a lower signal level, whereas the signals in range 202 should be adapted to a higher signal level for a good perception by the user. Similarly, the signals in range 203 should be output with a strongly decreased signal level.

In the lower part of FIG. 4 the corresponding estimated loudness of the ideally adjusted level in the upper part is shown. When the lower part of FIG. 2 is compared to the lower part of FIG. 4, it can be deduced that a loudness evaluation as shown in FIG. 4 is preferred to the loudness evaluation as shown in FIG. 3. The loudness evaluation of FIG. 4 can be perceived better than the loudness evaluation of FIG. 3. A smoothed, relatively constant loudness is reached and visualized here.

Figure 5:
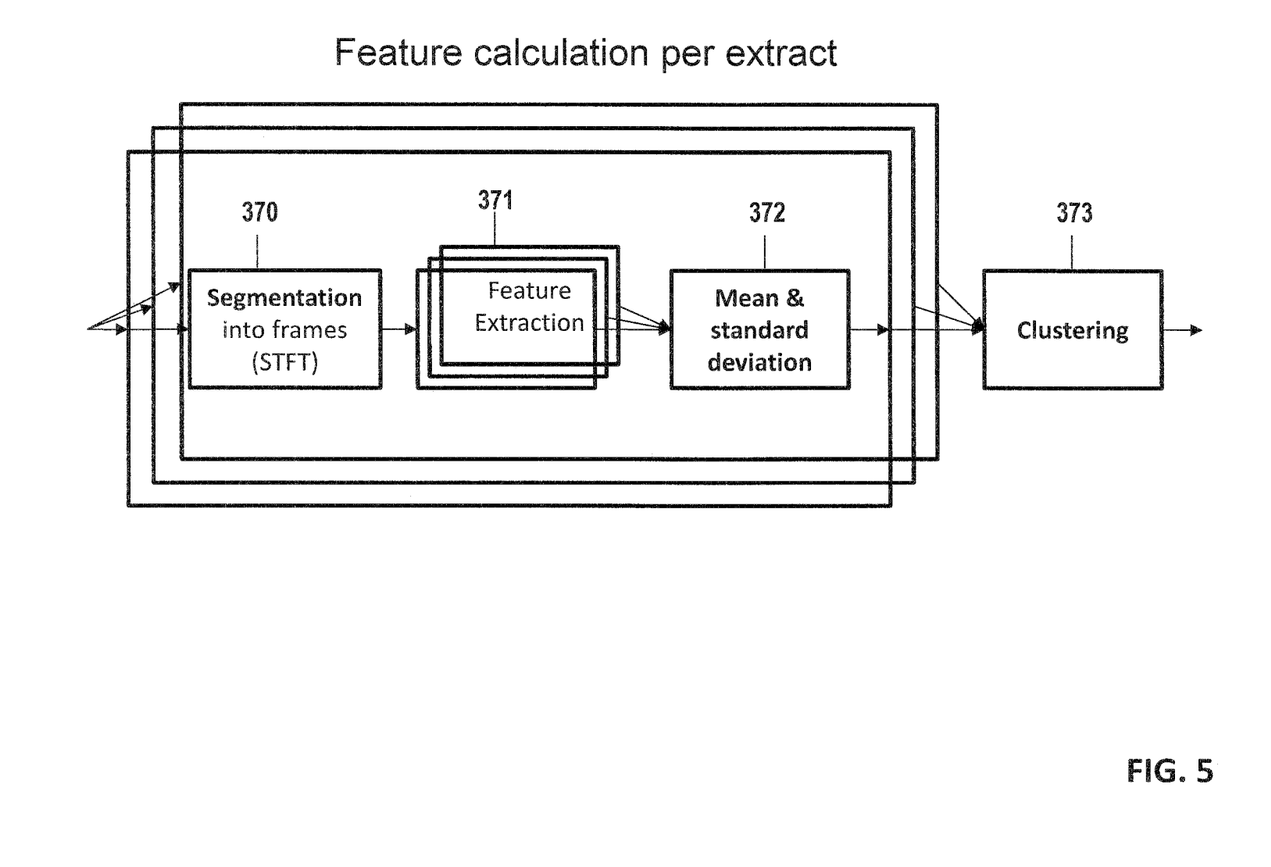
FIG. 5 schematically shows how speech signal components are detected in a speech detection unit used in the audio analysing unit of FIG. 2.

FIG. 5 shows a more detailed view of part of the speech detection unit. The speech detection unit has to decide if the speech input signal comprises speech components or not. To this end the speech input signal may be separated into frames of a defined length in a segmentation unit 370, e.g. two seconds and for each frame features are calculated and extracted in a feature extraction unit 371. Accordingly the speech input signal is segmented into frames and input into buffers for feature extraction, wherein for each buffer content a feature extraction is carried out. Based on the extracted features a classification is carried out in unit 372. By way of example a mean and standard deviation may be calculated. Finally in unit 373 a clustering is carried out. In this clustering unit 373 it is tried to find class label for each frame to determine clustering centres in feature space and then assigning each feature vector to the closest centre. As an example a K-means algorithm may be used.

The extracted features in unit 371 may comprise features such as the total spectral power, a Zero-crossing rate or Mel-frequency cepstral coefficients (MFCCs).

It should be understood that any other method know in the art could be used to detect speech signal components in the speech input signal. The speech detection should be especially configured to discriminate speech and text occurring in a song. Only the speech components of a spoken language should be detected so that these components can be handled differently by the gain determination unit compared to other non-speech components in the N channel audio input signal.

The output of the speech detection unit can be a likelihood between 0% and 100%. If the likelihood is above a certain level the speech detection unit may assume that speech is present in the speech input channel and may inform the gain determination unit accordingly so that the latter can control the speech input channel in a different way compared to the other audio input channels. If the speech detection unit assumes that no speech is present in the speech input channel, both the speech input channel and the other audio input channels can be adapted in the same way.

Figure 6:
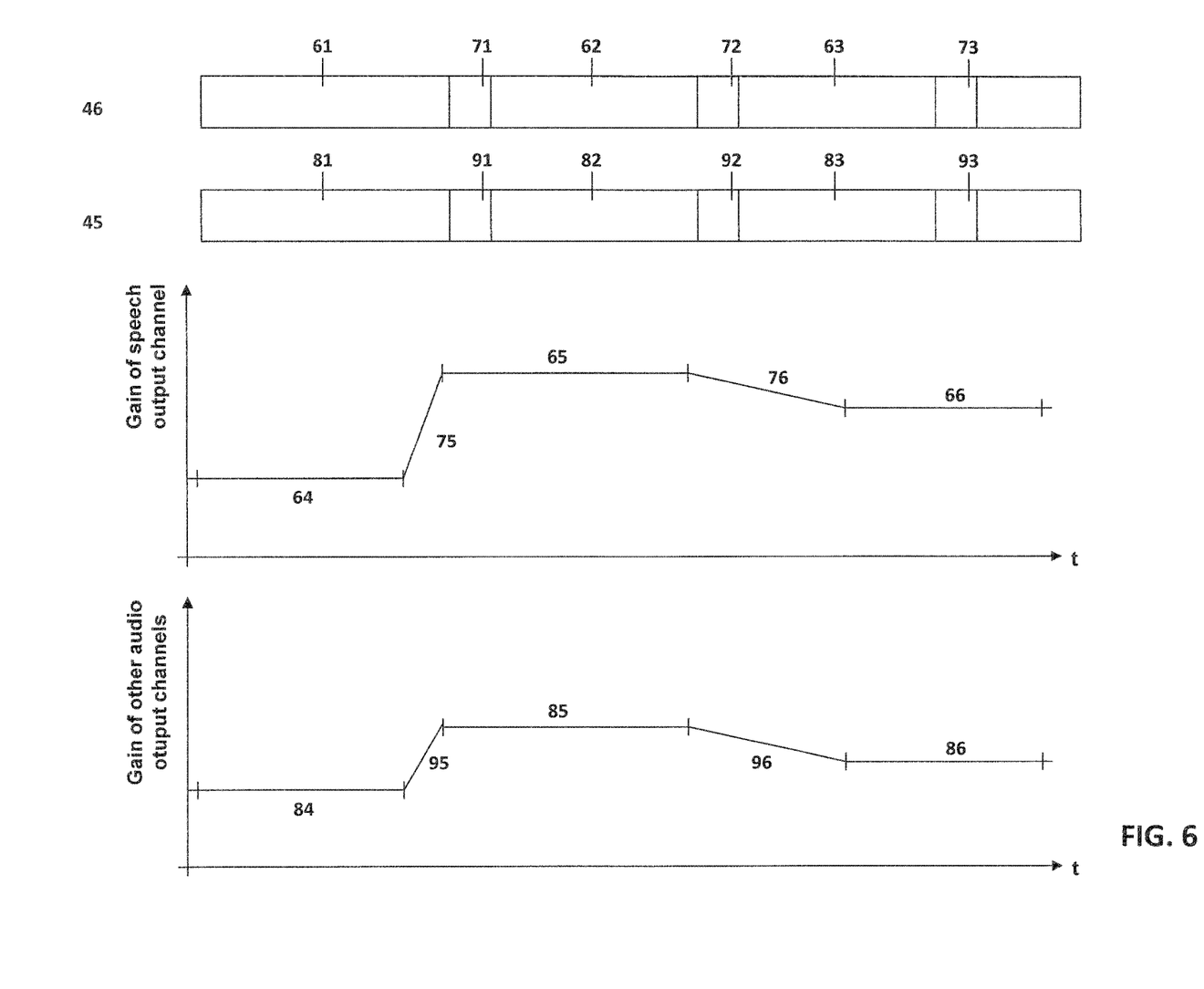
FIG. 6 schematically shows the introduction of time constants into the audio signal representing the gain change from one block of the N channel audio input signal to another block.

In FIG. 6 different samples 61 to 63 of one of the speech output channel 46 are shown separated by different time constants 71 to 73. The time constants 71 to 73 indicate how the loudness should be adapted from one sample to the next sample. The time constant could be a raising time constant or a falling time constant. The raising time constant indicates how the signal gain is increased from one sample to the next sample, whereas the falling time constant indicates the gain decrease from one sample to the next sample. The time constants 71 to 73 are determined in such a way that the raising time constants can be adapted much more rapidly than the falling time constants. By way of example, if a signal pause is determined between two tracks or within a track, the audio signal level should be not increased in order to avoid the amplification of noise. When a new track starts, high signal levels may occur directly after very low signal levels. The raising time constants of the loudness estimation have to be adapted accordingly in order to avoid that the signal level at the beginning of a new track is heavily increased. The falling time constant in the case of a audio signal level decrease only allow a slower decrease of the signal level compared to the increase. Furthermore, the time constants are adaptive time constants meaning that the longer a track is, the slower the time constants react. This can be valid for the increasing and decreasing time constants. A smoothed loudness estimation guarantees also a loudness estimation in a way like humans perceive loudness. Peaks and dips are smoothed out by the human auditory system. The fact that the time constants are varying slower with the increase time of an audio track helps to maintain the dynamics of the audio signal. However, also when a long runtime of a music signal is reached, a shorter reaction time of increasing loudness guarantees adequate reaction to fast signal increases. Furthermore the time constants are such that the components comprising speech in the speech output channel are adapted in a different way compared to components of the other audio output channel. The upper part of FIG. 6 furthermore shows different samples of the other audio output channels 45 separated by different time constants 91 to 93.

In the lower part of FIG. 6 the gain increase and gain decrease is shown for the output signal 45 and 46 over time. For a first block 64 of music samples a first gain 75 is determined as shown. For a following signal block 65 an increased gain is determined followed by signal block 66 with a slightly decreased gain so that a gain decrease is applied as symbolized by 76. Based on the loudness adaptation using the time constants a gain for each block is determined, i.e. a target gain for each block. The target gain for block n is then attained in a linear ramp starting from the target gain of the previous block n−1. In the example shown in the lower part the gain increase and decrease is shown for the speech output channel containing different samples 84 to 86 with corresponding gains 95 and 96. It is assumed that speech is detected after the end of block 64. Furthermore it is assumed that the speech signal components should be increased compared to other components in order to increase the intelligibility of the speech components. When gain 75 is compared to gain 95 it can be deduced that the speech output channel 46 has received a stronger increase compared to the other audio output channels 45.

If a pause in a track or between two tracks is determined, the time constants may be reset. The pause detection or track detection carried out in the signal analyzing unit 30 of FIG. 2 is symbolized by the pause detection unit 33 and the track detection unit 34. In the embodiment of FIG. 2 the loudness determination unit 31, the time constant generation unit 32, the pause and the track detection units 33 and 34, the gain determination unit 35, the down-mix unit 36 and the speech detection unit 37 are shown as separate units. However, it should be clear to one skilled in the art that the different units may be incorporated into fewer units and that the units may be combined in several units or even in one unit. Furthermore, the signal analyzing unit may be designed by hardware elements or by software or by a combination of hardware and software.

In FIG. 7 a first example of the automatic loudness adaptation is shown. In the upper part of FIG. 7 the audio input signal before the loudness estimation is shown. As can be seen from the two channels of the audio input signal, the input signals cover different input level ranges. The maximum input level may be 0 dB full scale. In the lower part of FIG. 7 the audio output signal 19 after loudness estimation and gain adaptation is shown. As can be seen from the lower part of FIG. 7, the average signal level is set to −12 dB full scale. At the same time the dynamic structure of the audio signal is preserved.

In FIG. 8 another example is shown in which the input level has a maximum input level of −20 dB full scale. In the lower part of FIG. 8 the audio output signal 19 is shown after loudness estimation and gain adaptation. Again the dynamic structure is preserved and the average signal level is again −12 dB full scale. If the input signal shown in the upper part of FIGS. 7 and 8 was output to the user, the user would have to adjust the volume frequently in order to avoid signal levels that are unpleasant high and in order to increase the signal for parts of the audio signal where the signal level is too low for listening.

Figure 9:
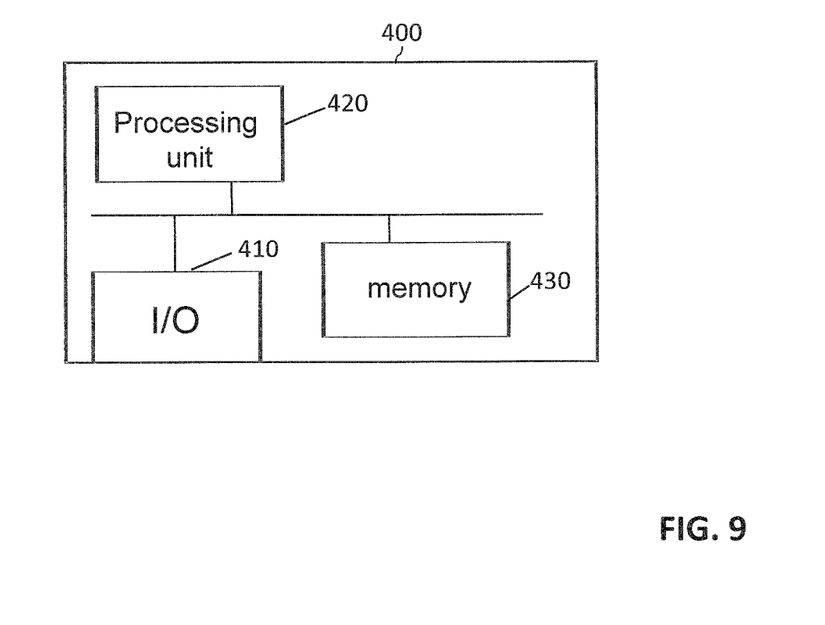
FIG. 9 shows a schematic representation of a system in which speech signal components are adapted in a different way than other signal components

FIG. 9 shows a schematic architectural view of a system 400. The system 400 can be configured to carry out all the steps discussed above in connection with the other Figures. The system 400 comprises an interface 410 with an input unit and output unit not shown in detail. The interface is provided for outputting the combined output signal 60 shown in FIG. 1. The interface is further configured to receive the different input signals 20, 21 discussed above in connection with FIG. 1.

Furthermore, a processing unit 420 is provided which is responsible for the operation of the system 400. The processing unit 420 comprising one or more processors, e.g. Digital Signal processors (DSP) can carry out instructions stored on a memory 430 wherein the memory may include a read-only memory, a random access memory, a mass storage or the like. The memory can furthermore include suitable program code to be executed by the processing unit 420 so as to implement the above described functionalities of the system in which speech signal components are adapted in a different way compared to other audio input channels of the N channel audio input signal as discussed above in connection with FIGS. 1 to 8.

With the present application a frequent volume adjustment by the user is not necessary anymore, as the system estimates the loudness and automatically and dynamically aligns a gain before output. Furthermore the gain of the different components are adapted such that speech components present in the N channel signal can be better understood.

The invention claimed is:

1. A method for adapting a gain of at least one channel audio input signal to generate at least one channel audio output signal, wherein the at least one channel audio input signal includes a speech input channel, in which speech signal components, if present in the at least one channel audio input signal, are present, and the at least one channel audio input signal further includes other audio input channels, the method comprising:
dynamically determining a perceived loudness of the at least one channel audio input signal,
determining whether speech signal components are present in the speech input channel,
wherein, if the speech signal components are present in the speech input channel,
dynamically adapting a gain of the other audio input channels in a first gain control unit based on the determined perceived loudness of the at least one channel audio input signal with a first gain parameter such that at least two consecutive tracks of other audio output channels output from the first gain control unit are limited to a predefined range of signal levels or a predefined loudness range, and dynamically adapting a gain of the speech input channel in a second gain control unit based on the determined loudness of the at least one channel audio input signal with a second gain parameter such that at least two consecutive tracks of a speech output channel output from the second gain control unit are limited to the predefined range of signal levels or loudness range, wherein the second gain parameter is different from the first gain parameter, wherein determining whether speech signal components are present in the speech input channel comprises:

segmenting the speech input channel into audio frames, carrying out a feature extraction on a per frame bases, and clustering the extracted features in a feature space.

2. The method of claim 1, wherein the first gain parameter and the second gain parameter are determined such that a ratio of a signal level of the speech input channel to a signal level of the speech output channel is smaller than a ratio of a signal level of the other audio input channels to a signal level of the other audio output channels.

3. The method of claim 1, wherein the first gain parameter and the second gain parameter are determined such that a signal level of the speech input channel is increased by the second gain parameter by a higher amount compared to a signal level of the other audio input channel which is increased by the first gain parameter.

4. The method of claim 1, wherein the first gain parameter and the second gain parameter are determined such that a signal level of the speech input channel is decreased by the second gain parameter by a smaller amount compared to a signal level of the other audio input channel decreased by the first gain parameter.

5. The method of claim 1, wherein the perceived loudness is determined for the at least one channel audio input signal for all channels in total.

6. The method of claim 1, wherein the perceived loudness is determined for separate groups of the at least one channel audio input signal separately.

7. The method of claim 1, further comprising estimating an ambient noise in a space to which the at least one channel audio input signal is output, wherein the gain of the other audio input channels and the speech input channel are adapted based on the estimated ambient noise.

8. The method of claim 7, wherein the at least one channel audio input signal is output to an interior of a vehicle, wherein estimating the ambient noise comprises determining a vehicle speed and determining the ambient noise based on the determined vehicle speed.

9. The method of claim 1, wherein if no speech signal components are present in the speech input channel, the other audio input channels and the speech input channel are adapted with a same gain.

10. A system configured to adapt a gain of at least one channel audio input signal to generate at least one channel audio output signal, wherein the at least one channel audio input signal includes a speech input channel, in which speech signal components, if present in the at least one channel audio input signal, are present, and the at least one channel output signal further includes other audio input channels, the system comprising:

a loudness determining unit configured to determine a perceived loudness of the at least one channel audio input signal, a speech detection unit configured to determine whether speech signal components are present in the speech input channel, a first gain control unit configured to control a gain of the other audio input channels, a second gain control unit configured to control a gain of the speech input channel, wherein if the speech detection unit detects speech signal components present in the speech input signal, the first gain control unit dynamically adapts the gain of the other audio input channels based on the determined perceived loudness of the at least one channel audio input signal with a first gain parameter such that at least two consecutive tracks of other audio output channels output from the first gain control unit are limited to a predefined range of signal levels or a predefined loudness range, the second gain control unit dynamically adapts the gain of the speech input channel based on the determined loudness of at least one channel audio input signal with a second gain parameter such that at least two consecutive tracks of a speech output channel output from the second gain control unit are limited to the predefined range of signal levels or loudness range, wherein the second gain parameter is different from the first gain parameter, wherein the speech detection unit is configured to determine whether speech signal components are present in the speech input channel based on the steps including:

segmenting the speech input channel into audio frames, carrying out a feature extraction on a per frame bases, and clustering the extracted features in a feature space.

11. The system of claim 10, wherein the first gain control unit and the second gain control unit determine the first gain parameter and the second gain parameter such that a ratio of a signal level of the speech input channel to the signal level of the speech output channel is smaller than a ratio of the signal level of the other audio input channels to a signal level of the other audio output channels.

12. The system of claim 10, wherein the first gain control unit and the second gain control unit determine the first gain parameter and the second gain parameter such that a signal level of the speech input channel is increased by the second gain parameter by a higher amount than a signal level of the other audio input channel increased by the first gain parameter.

13. The system of claim 10, wherein the first gain control unit and the second gain control unit determine the first gain parameter and the second gain parameter such that a signal level of the speech input channel is decreased by the second gain parameter by a smaller amount than the signal level of the other audio input channel decreased by the first gain parameter.

14. The system of claim 10, wherein the loudness determining unit is configured to determine the perceived loudness for the at least one channel audio input signal for all channels together as a combined loudness level.

15. The system according to claim 10, wherein the loudness determining unit is configured to determine the perceived loudness for separate groups of the at least one channel audio input signal separately.

16. The system of claim 10, further comprising a noise estimator configured to estimate an ambient noise in a space to which the at least one channel audio input signal is output, wherein the first gain control unit and the second gain control unit are configured to adapt the gain of the other audio input channels and the speech input channel based on the estimated ambient noise.

17. The system according to claim 16, wherein the at least one channel audio input signal is output to an interior of a vehicle and the noise estimator is configured to determine a vehicle speed and to determine the ambient noise based on the determined vehicle speed.

18. A method for adapting a gain of at least one channel audio input signal to generate at least one channel audio output signal, wherein the at least one channel audio input signal includes a speech input channel, in which speech signal components, if present in the at least one channel audio input signal, are present, and the at least one channel audio input signal further includes other audio input channels, the method comprising:
   determining a perceived loudness of the at least one channel audio input signal,
   determining whether speech signal components are present in the speech input channel,
   wherein, if the speech signal components are present in the speech input channel,
   adapting a gain of the other audio input channels in a first gain control unit based on the determined perceived loudness of the at least one channel audio input signal such that at least two consecutive tracks of other audio output channels output from the first gain control unit are limited to a predefined range of signal levels or a predefined loudness range, and
   adapting a gain of the speech input channel in a second gain control unit based on the determined loudness of the at least one channel audio input signal such that at least two consecutive tracks of a speech output channel output from the second gain control unit are limited to the predefined range of signal levels or loudness range, wherein the second gain parameter is different from the first gain parameter,
   wherein determining whether speech signal components are present in the speech input channel comprises:
   segmenting the speech input channel into audio frames, carrying out a feature extraction on a per frame bases, and clustering the extracted features in a feature space.

* * * * *